(12) United States Patent
Ching et al.

(10) Patent No.: US 9,006,079 B2
(45) Date of Patent: Apr. 14, 2015

(54) METHODS FOR FORMING SEMICONDUCTOR FINS WITH REDUCED WIDTHS

(71) Applicant: Taiwan Semiconductor Manufacturing Company, Ltd., Hsin-Chu (TW)

(72) Inventors: Kuo-Cheng Ching, Zhubei (TW); Shi Ning Ju, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 267 days.

(21) Appl. No.: 13/656,025

(22) Filed: Oct. 19, 2012

(65) Prior Publication Data

US 2014/0113432 A1 Apr. 24, 2014

(51) Int. Cl.
*H01L 21/8234* (2006.01)
*H01L 21/762* (2006.01)
*H01L 29/66* (2006.01)
*H01L 29/78* (2006.01)

(52) U.S. Cl.
CPC .... *H01L 21/76224* (2013.01); *H01L 29/66818* (2013.01); *H01L 29/7854* (2013.01)

(58) Field of Classification Search
CPC .......... H01L 21/76224; H01L 21/76232; H01L 21/76229; H01L 21/76235; H01L 21/76283; H01L 21/823431; H01L 29/785; H01L 29/66818

USPC ............... 257/329, E29.262; 438/424
See application file for complete search history.

(56) References Cited

U.S. PATENT DOCUMENTS

| | | | |
|---|---|---|---|
| 6,323,107 B1* | 11/2001 | Ueda et al. | 438/435 |
| 6,444,540 B2* | 9/2002 | Kawada et al. | 438/424 |
| 6,991,994 B2* | 1/2006 | Sun et al. | 438/445 |
| 2002/0001918 A1* | 1/2002 | Park | 438/424 |
| 2002/0005529 A1* | 1/2002 | Horita et al. | 257/200 |
| 2002/0065023 A1* | 5/2002 | Kwok | 451/37 |
| 2003/0181049 A1* | 9/2003 | Huang et al. | 438/694 |
| 2005/0236680 A1* | 10/2005 | Yoo | 257/411 |
| 2006/0051926 A1* | 3/2006 | Jeong et al. | 438/296 |
| 2008/0014699 A1* | 1/2008 | Torek et al. | 438/257 |
| 2008/0057670 A1* | 3/2008 | Kim et al. | 438/424 |
| 2011/0147811 A1* | 6/2011 | Kavalieros et al. | 257/288 |
| 2011/0230033 A1* | 9/2011 | Aritome | 438/424 |
| 2014/0008734 A1* | 1/2014 | Lu | 257/401 |

* cited by examiner

*Primary Examiner* — Steven J Fulk
(74) *Attorney, Agent, or Firm* — Slater & Matsil, L.L.P.

(57) ABSTRACT

A method includes forming Shallow Trench Isolation (STI) regions extending from a top surface of a semiconductor substrate into the semiconductor substrate, and after the forming the STI regions, oxidizing an upper portion of a semiconductor strip between the STI regions. A width of the upper portion of the semiconductor strip is reduced by the oxidizing. The STI regions are recessed, until a portion of the upper portion of the semiconductor strip is higher than a top surface of remaining portions of the STI regions to form a semiconductor fin.

20 Claims, 5 Drawing Sheets

METHODS FOR FORMING SEMICONDUCTOR FINS WITH REDUCED WIDTHS

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. A typical FinFET includes a semiconductor fin above a substrate, which fin is used to form the channel region of the FinFET. The channel region includes sidewall portions and sometimes a top surface portion of the semiconductor fin. When the channel region includes the sidewalls portions but not the top surface portion, the respective FinFET is referred to as a dual-gate FinFET. When the channel regions include the sidewalls portions and the top surface portion, the respective FinFET is referred to as a tri-gate FinFET.

To improve the channel control and reduce leakage currents in the FinFETs, it is desirable that the widths of the semiconductor fins of the FinFETs are reduced. In conventional methods, the fins were oxidized to reduce the widths. The oxidation was performed after the trenches for Shallow Trench Isolation (STI) regions have been formed by etching a semiconductor substrate. The portions of the semiconductor substrate between the trenches thus form semiconductor strips, which are thinned through oxidation. After the oxidation, the resulting oxide is removed, and hence the semiconductor strips become thinner. The conventional methods, however, suffer from yield and performance issues. When the widths of the semiconductor strips are reduced, the semiconductor strips may be distorted, resulting in the degradation in the performance of the FinFETs or the loss of yield.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistors (FinFET) and the method of forming the same are provided in accordance with various exemplary embodiments. The intermediate stages of forming the FinFET and the respective semiconductor fin are illustrated. The variations of the embodiments are discussed. Throughout the various views and illustrative embodiments, like reference numbers are used to designate like elements.

Figure 1:
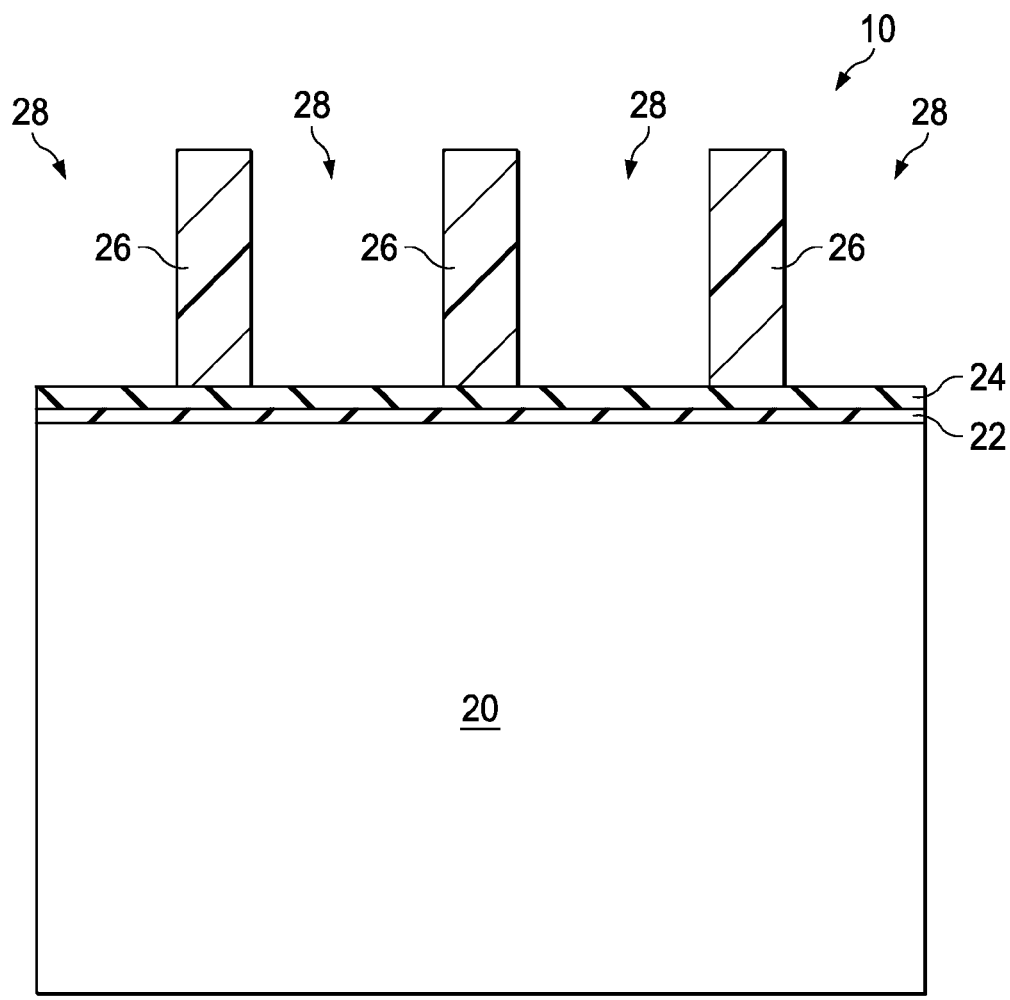
FIGS. 1 through 8 are cross-sectional views of intermediate stages in the manufacturing of a Fin Field-Effect Transistor (FinFET) and the respective semiconductor fins in accordance with some exemplary embodiments.

Referring to FIG. 1, semiconductor substrate 20, which is a portion of wafer 10, is provided. In some embodiments, semiconductor substrate 20 includes silicon. Other commonly used materials such as carbon, germanium, gallium, arsenic, nitrogen, indium, and/or phosphorus may also be included in semiconductor substrate 20. Semiconductor substrate 20 may be a bulk substrate or a Semiconductor-On-Insulator (SOI) substrate.

Pad layer 22 and hard mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and hard mask layer 24. Pad layer 22 may also act as an etch stop layer for etching hard mask layer 24. In some embodiments, hard mask layer 24 is formed of silicon nitride, for example, using Low-Pressure Chemical Vapor Deposition (LPCVD). In other embodiments, hard mask layer 24 is formed by thermal nitridation of silicon, Plasma Enhanced Chemical Vapor Deposition (PECVD), or plasma anodic nitridation. Hard mask layer 24 is used as an etching mask during subsequent photolithography processes. Photo resist 26 is formed on hard mask layer 24 and is then patterned, forming openings 28 in photo resist 26.

Figure 2:
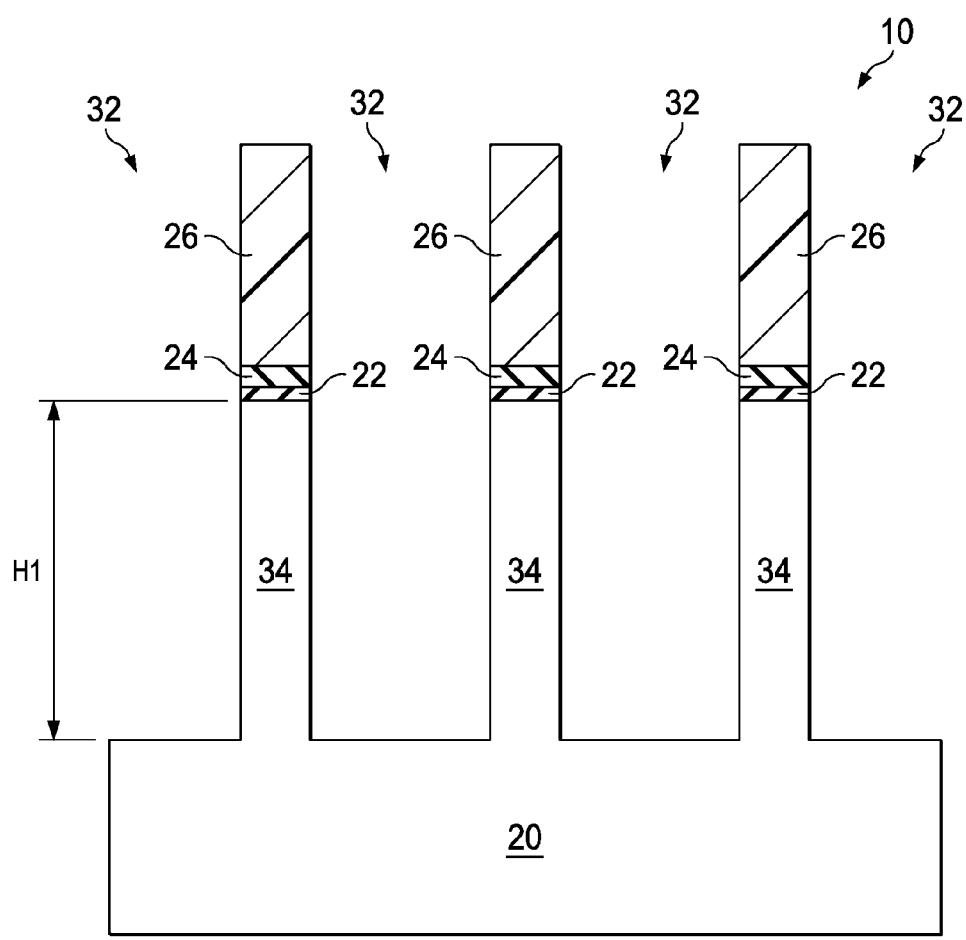
Figure 3:
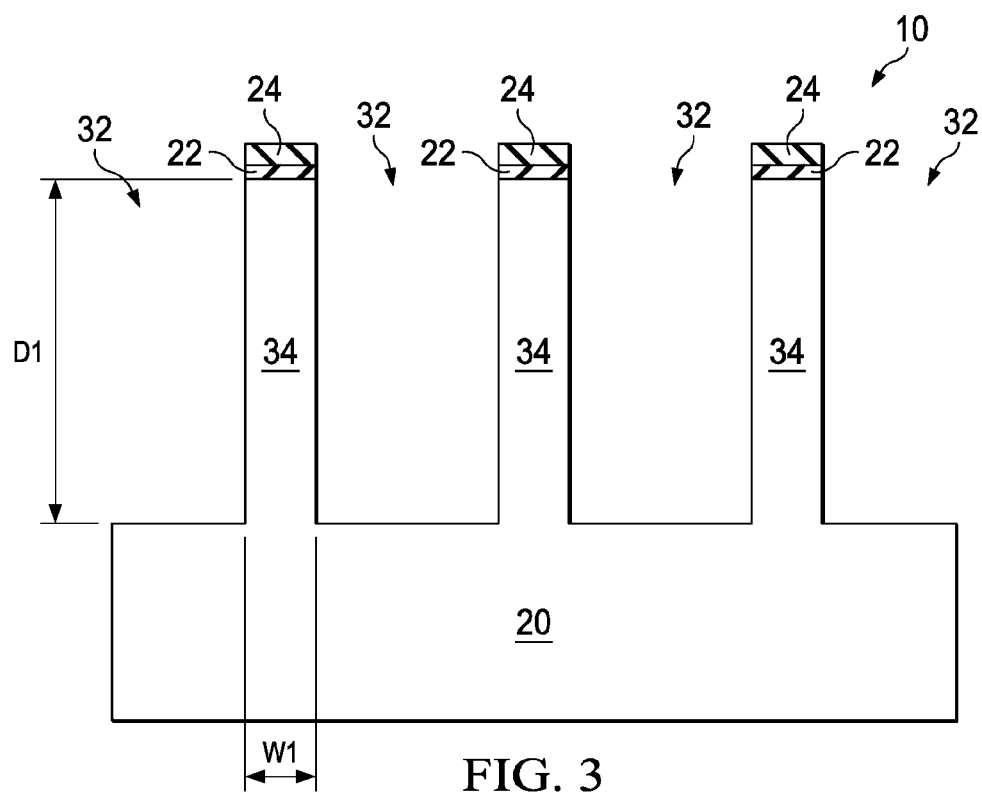

Referring to FIG. 2, hard mask layer 24 and pad oxide layer 22 are etched through openings 28, exposing underlying semiconductor substrate 20. The exposed semiconductor substrate 20 is then etched, forming trenches 32. The portions of semiconductor substrate 20 between trenches 32 form semiconductor strips 34. Trenches 32 may be parallel to each other, and closely located from each other. After the etching of semiconductor substrate 20, photo resist 26 is removed. The resulting structure is shown in FIG. 3. Next, a cleaning may be performed to remove a native oxide of semiconductor substrate 20. The cleaning may be performed using diluted hydrofluoric (HF) acid.

Depth D1 of trenches 32 may be between about 1,000 Å and about 1,900 Å, and width W1 of semiconductor strips 34 may be between about 100 Å and about 250 Å. One skilled in the art will realize, however, that the dimensions and values recited throughout the descriptions are merely examples, and may be changed to suit different scales of integrated circuits.

Figure 4:
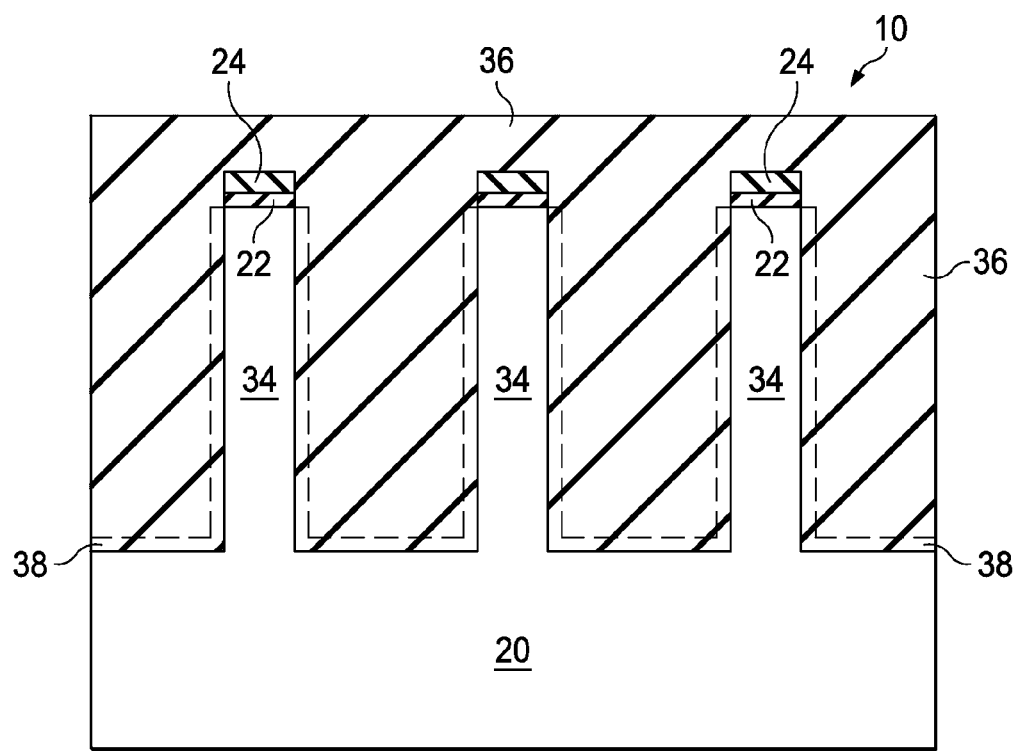

Referring to FIG. 4, trenches 32 are filled with dielectric material 36. Dielectric material 36 may include silicon oxide, and hence is referred to as oxide 36 hereinafter, although other dielectric materials, such as SiN, SiC, or the like, may also be used. In some embodiments, oxide 36 is formed by filling a flowable material, which filling process includes spin coating or other applicable methods. The flowable material may include trisilylamine (TSA), which is then cured and converted as an oxide. In alternative embodiments, the filling is performed through a deposition process, which may be performed through a Chemical Vapor Deposition (CVD) method. In yet alternative embodiments, the filling process may be performed using a High Aspect-Ratio Process (HARP), wherein process gases may include tetraethylorthosilicate (TEOS) and $O_3$ (ozone). Dielectric material 36 is filled until its top surface is higher than the top surface of hard mask layer 24.

In some embodiments, dielectric material 36 includes liner oxide 38, which is formed before filling the bulk portion of trenches 32. In some embodiment, liner oxide 38 is a thermal oxide having a thickness between about 20 Å to about 500 Å. In other embodiments, liner oxide 38 is formed using in-situ steam generation (ISSG). In yet other embodiments, liner oxide 38 is formed using a deposition technique that can form conformal oxide layers, such as Selective Area Chemical Vapor Deposition (SACVD) or the like. The formation of liner oxide 38 may round the corners of trenches 32, which reduces the electrical fields, and hence improves the performance of the resulting integrated circuit.

An annealing may be performed after the filling of dielectric material 36. In the embodiments wherein dielectric material 36 is formed using the flowable material, the annealing may be performed after the curing process. In some embodiments, the annealing is performed at a temperature between about 400° C. and about 1200° C. The process for the annealing may include thermal annealing in an oven, although other annealing methods may be used. The duration of the annealing may be between about 15 minutes and about 210 minutes in accordance with some exemplary embodiments. Through the annealing, dielectric material 36 may be densified.

Figure 5:
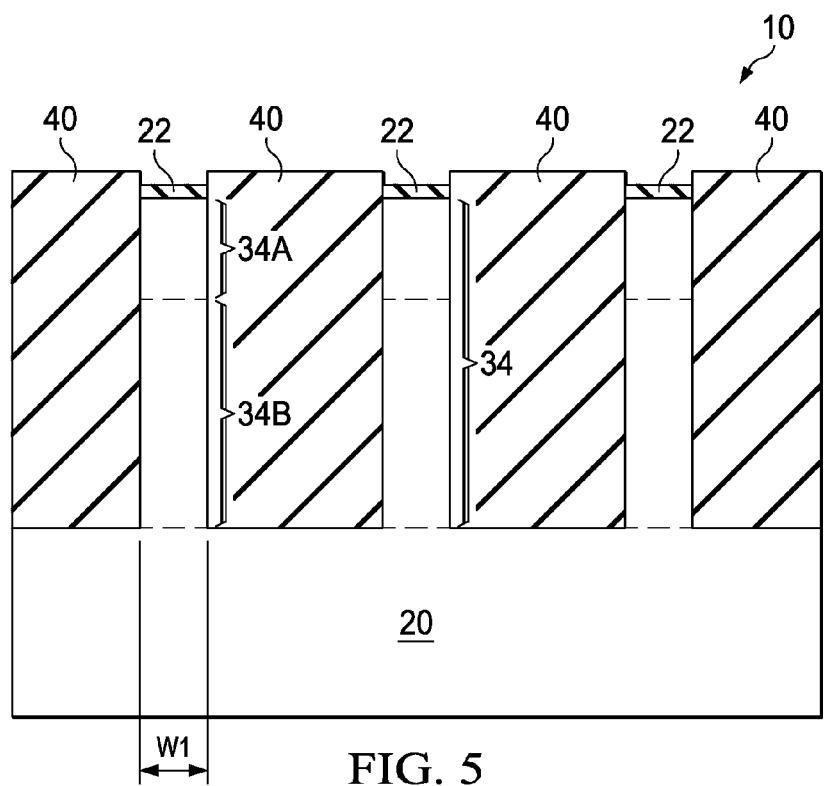

A planarization such as a Chemical Mechanical Polish (CMP) is then performed. Hard mask layer 24 is used as a CMP stop layer, so that the top surface of the remaining dielectric material 36 is level with or slightly lower than the top surface of hard mask layer 24, and the resulting structure is shown in FIG. 5. The remaining portions of dielectric material 36 are referred to as Shallow Trench Isolation (STI) regions 40 hereinafter. Hard mask layer 24, if formed of silicon nitride, may be removed by a wet process using $H_3PO_4$.

After the CMP, a further annealing may be performed, for example, using the method similar to the annealing that is performed before CMP. In some embodiments, the annealing is performed at a temperature between about 400° C. and about 1,200° C. The duration of the annealing may be between about 15 minutes and about 210 minutes in accordance with some exemplary embodiments. Through the annealing, STI regions 40 may be further densified, and the quality of STI regions 40 is improved further. After the CMP and the further annealing, hard mask layer 24 is removed.

Figure 6:
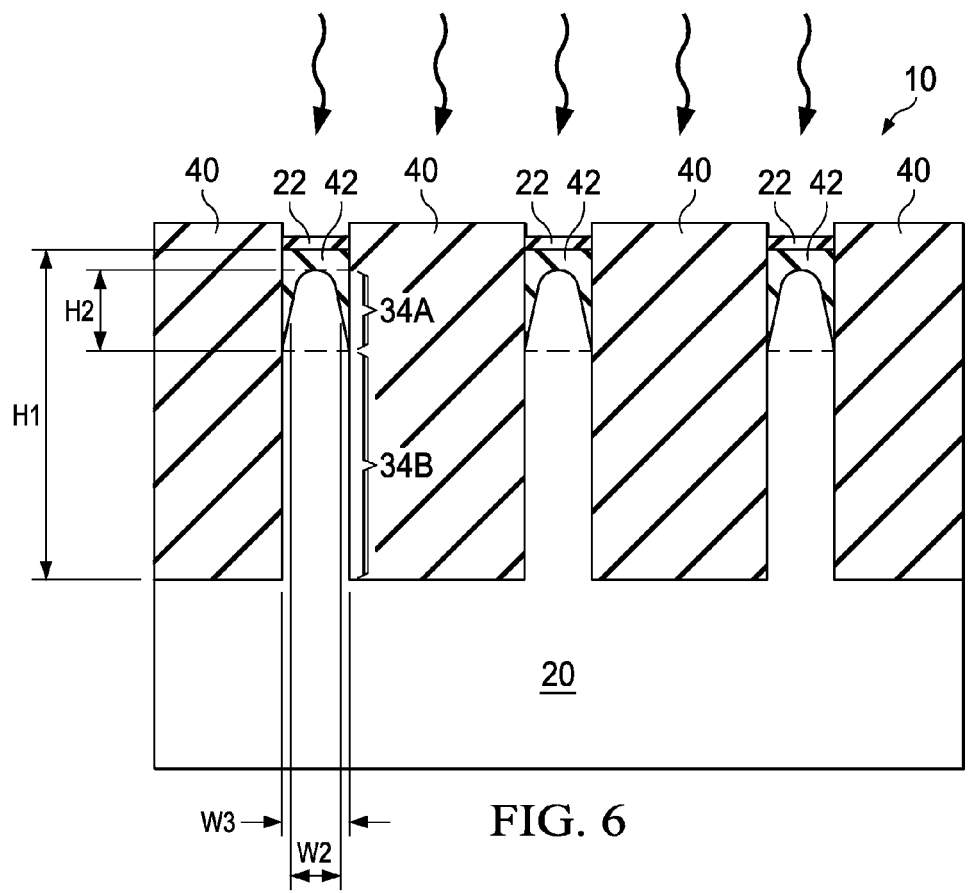

FIG. 6 illustrates the oxidation of a top portion (also referred to as an upper portion) of semiconductor strips 34. In some embodiments, the oxidation is performed using In-Situ Steam Generation (ISSG), in which the steam (represented by arrows 45) of water is generated, and is driven through pad oxide layer 22 and the top portion of STI regions 40 to reach the top portion of semiconductor strips 34. The ISSG may be performed at temperatures between about 800° C. and about 1100° C. The pressure for the ISSG may be between about 5 torr and about 20 torr. In alternative embodiments, the oxidation may be performed using a dry oxidation method, wherein the process gas my include an oxygen-containing gas such as $O_2$, and may include $N_2$, $H_2$, and/or the like, and the temperature may be between about 800° C., and about 1200° C. By performing the annealing when pad oxide layer 22 and STI regions 40 still protect semiconductor strips 34, the oxidation is more controllable. The use of ISSG further improves the ability for controlling the oxidation. In addition, through the oxidation, the quality of STI regions 40 is further improved.

As a result of the oxidation, top portions and sidewall portions of semiconductor strips 34 are oxidized. In some embodiments, upper portions 34A (FIG. 5) of semiconductor strips 34 include oxidized portions, while lower portions 34B (which also include bottom portions) of semiconductor strips 34 do not include oxidized portions. Such degree of oxidation may be achieved through the use of pad oxide layer 22 and STI regions 40 to control the oxidation process, as addressed in preceding paragraphs. In some exemplary embodiments, height H2 of the oxidized portions 34A is between about 20 nm and about 100 nm. Height H2 may also be between about 2 percent and about 40 percent of height H1 of semiconductor strips 34.

As a result of the oxidation, upper portions 34A of semiconductor strips 34 are thinned, and oxide regions 42 are generated as a result of the oxidization of the top and the sidewalls of portions 34A. Oxide regions 42 comprise the oxide of the semiconductor substrate 20. In the embodiments wherein semiconductor substrate 20 is a silicon substrate, oxide regions 42 comprise silicon oxide. In some embodiments, the resulting upper portions 34A have a tapered profile, with lower portions of portions 34A wider than upper portions of portions 34A. The corners of upper portions 34A are also rounded. In some embodiments, at the middle height of upper portions 34A, the middle width W2 may be smaller than middle width W1 (FIG. 5) by 3 nm to about 6 nm, wherein widths W1 and W2 are measured at the same level. The lower portions 34B are not oxidized, and hence their widths W3 are greater than widths W2. Furthermore, compared to bottom portions 34B, the widths of upper portions 34A are reduced relatively abruptly.

Figure 7:
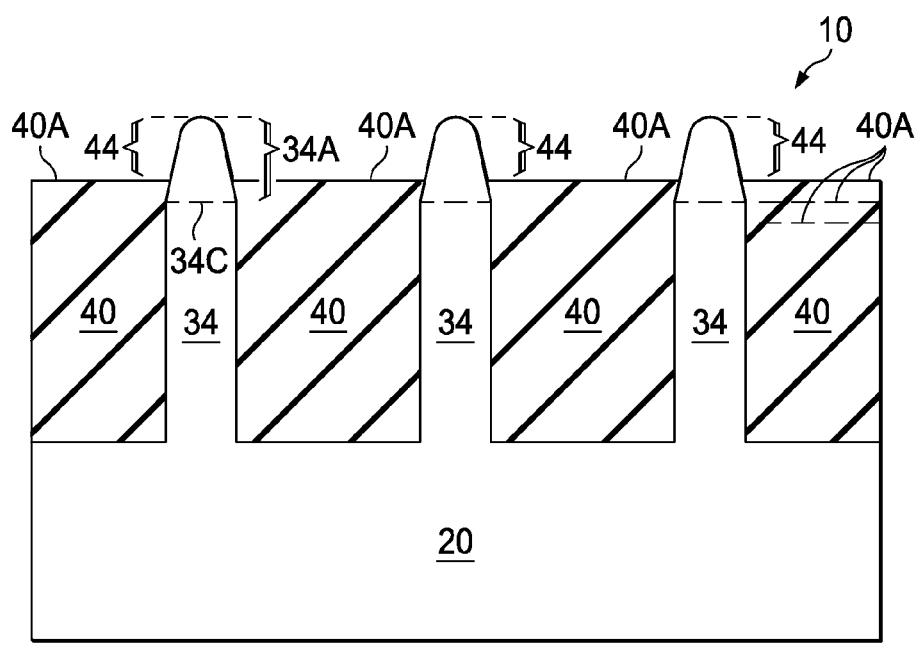

Next, pad oxide layer 22 is removed. After the removal of pad oxide layer 22, oxide regions 42 are removed, and STI regions 40 are also recessed. The resulting structure is shown in FIG. 7. In some embodiments, the removal of pad oxide layer 22 and oxide regions 42 and the recessing of STI regions 40 are performed using a diluted HF solution. As a result, some portions of semiconductor strips 34, which portions are referred to as semiconductor fins 44 hereinafter, are over top surfaces 40A of STI regions 40. In some embodiments, top surfaces 40A of STI regions 40 are higher than the bottoms 34C of portions 34A of semiconductor strips 34, as illustrated in FIG. 7. In alternative embodiments, top surfaces 40A of STI regions 40 may be at the positions illustrated by dashed lines, and may be level with, or lower than, the bottoms of top portions 34A.

Figure 8:
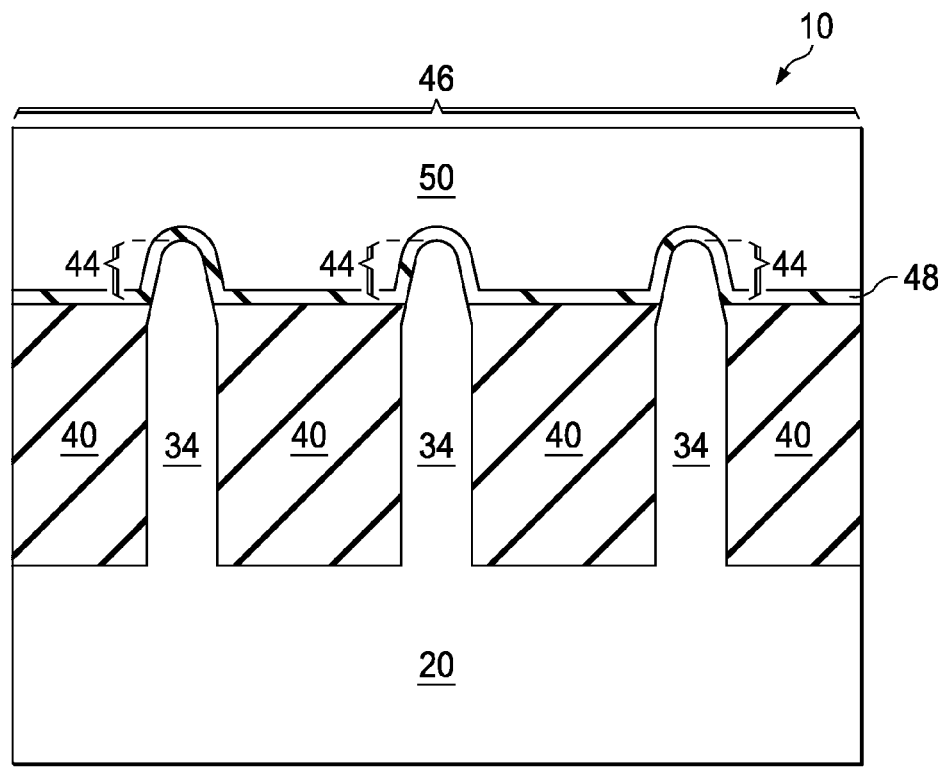

FIG. 8 illustrates the formation of FinFET 46. Gate dielectric 48 is formed to cover the top surfaces and sidewalls of fins 44. Gate dielectric 48 may be formed by a thermal oxidation, and hence may include thermal silicon oxide. In these embodiments, gate dielectric 48 is formed on the top surfaces of fins 44, but not on the main parts of the top surfaces of STI regions 40. Alternatively, gate dielectric 48 may be formed by a deposition process, and may be formed of high-k materials. Accordingly, gate dielectric 48 is formed on the top surfaces of fins 44 and the top surfaces of STI regions 40. Gate electrode 50 is then formed on gate dielectric 48. In some embodiments, gate electrode 50 covers more than one fin 44, so that the resulting FinFET 46 comprises more than one fin 44. In alternative embodiments, each of fins 44 may be used to form one FinFET. The remaining components of the FinFET, including source and drain regions and source and drain silicides (not shown), are also formed. The formation processes of these components are known in the art, and hence are not repeated herein.

In the embodiments, by thinning semiconductor strips 34 after the formation of STI regions, semiconductor strips 34 are protected by STI regions 40. Furthermore, the widths of the top portions of semiconductor strips 34, which are used to form FinFETs, are reduced, and the widths of lower portions 34B are not reduced. Accordingly, there is a smaller risk of incurring the distortion of the fins of FinFETs.

In accordance with embodiments, a method includes forming STI regions extending from a top surface of a semiconductor substrate into the semiconductor substrate, and after the forming the STI regions, oxidizing an upper portion of a semiconductor strip between the STI regions. A width of the upper portion of the semiconductor strip is reduced by the oxidizing. The STI regions are recessed, until a portion of the upper portion of the semiconductor strip is higher than a top surface of remaining portions of the STI regions to form a semiconductor fin.

In accordance with other embodiments, a method includes forming a patterned pad oxide layer over a semiconductor substrate, forming a patterned hard mask layer over the patterned pad oxide layer, and etching the semiconductor substrate to form trenches in the semiconductor substrate. The patterned pad oxide layer and the patterned hard mask layer are used as etching masks. The method further includes filling the trenches with a dielectric material, removing excess portions of the dielectric material to form STI regions in the trenches, and removing the patterned hard mask layer. After the removing the patterned hard mask layer, an upper portion of a semiconductor strip between the STI regions is oxidized, and a width of the upper portion of the semiconductor strip is reduced. After the oxidizing the upper portion of the semiconductor strip, the patterned pad oxide layer is removed.

In accordance with yet other embodiments, a method includes forming STI regions that extending from a top surface of a semiconductor substrate into the semiconductor substrate, with a portion of the semiconductor substrate between two neighboring ones of the STI regions forming a semiconductor strip. After the step of forming the STI regions, an upper portion of the semiconductor strip is thinned, while a lower portion of the semiconductor strip is not thinned. After the step of thinning the upper portion of the semiconductor strip, the STI regions is recessed, until a portion of the upper portion of the semiconductor strip is higher than top surfaces of remaining portions of the STI regions to form a semiconductor fin. After the recessing of the STI regions, the top surfaces of the remaining portions of the STI regions are level with or higher than a bottom of the upper portion of the semiconductor strip. A FinFET may then be formed on the semiconductor fin.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming Shallow Trench Isolation (STI) regions extending from a top surface of a semiconductor substrate into the semiconductor substrate;
    after the forming the STI regions, oxidizing an upper portion of a semiconductor strip between the STI regions, wherein a width of the upper portion of the semiconductor strip is reduced by the oxidizing, and wherein at a time the oxidizing the upper portion of the semiconductor strip is performed, top surfaces of the STI regions are higher than a top surface of the semiconductor strip; and
    recessing the STI regions, until a portion of the upper portion of the semiconductor strip is higher than a top surface of remaining portions of the STI regions to form a semiconductor fin.

2. The method of claim 1, wherein at a time the oxidizing the upper portion of the semiconductor strip is performed, a pad oxide layer is located over the semiconductor strip.

3. The method of claim 2 further comprising, after the oxidizing the upper portion of the semiconductor strip is performed, removing the pad oxide layer and an oxide generated in the step of oxidizing.

4. The method of claim 1, wherein the oxidizing the upper portion of the semiconductor strip is performed using In-Situ Steam Generation (ISSG), wherein a steam of water is generated by the ISSG, and wherein the upper portion of the semiconductor strip is oxidized by the steam.

5. The method of claim 1 further comprising:
    before the forming the STI regions, forming a patterned hard mask layer over the semiconductor strip; and
    after the forming the STI regions and before the oxidizing the upper portion of the semiconductor strip, removing the patterned hard mask layer.

6. The method of claim 1, wherein in the oxidizing the upper portion of the semiconductor strip, a lower portion of the semiconductor strip is not oxidized.

7. The method of claim 1 further comprising:
    after the recessing the STI regions, forming a gate dielectric on a top surface and sidewalls of the semiconductor fin; and
    forming a gate electrode over the gate dielectric.

8. A method comprising:
    forming a patterned pad oxide layer over a semiconductor substrate;
    forming a patterned hard mask layer over the patterned pad oxide layer;
    etching the semiconductor substrate to form trenches in the semiconductor substrate, wherein the patterned pad oxide layer and the patterned hard mask layer are used as etching masks;
    filling the trenches with a dielectric material;
    removing excess portions of the dielectric material to form Shallow Trench Isolation (STI) regions in the trenches;
    removing the patterned hard mask layer;
    after the removing the patterned hard mask layer, oxidizing an upper portion of a semiconductor strip between the STI regions, wherein a width of the upper portion of the semiconductor strip is reduced; and
    after the oxidizing the upper portion of the semiconductor strip, removing the patterned pad oxide layer.

9. The method of claim 8 further comprising, after the oxidizing the upper portion of the semiconductor strip, recessing the STI regions, until a portion of the upper portion of the semiconductor strip is higher than a top surface of remaining portions of the STI regions to form a semiconductor fin.

10. The method of claim 9 further comprising:
    forming a gate dielectric on a top surface and sidewalls of the semiconductor fin; and
    forming a gate electrode over the gate dielectric.

11. The method of claim 8, wherein the oxidizing the upper portion of the semiconductor strip is performed using In-Situ Steam Generation (ISSG), wherein a steam of water is generated by the ISSG, and wherein the upper portion of the semiconductor strip is oxidized by the steam.

12. The method of claim 8, wherein in the oxidizing the upper portion of the semiconductor strip, a lower portion of the semiconductor strip is not oxidized.

13. The method of claim 12, wherein the upper portion of the semiconductor strip has a height between about 2 percent and about 40 percent of a total height of the semiconductor strip.

14. A method comprising:
   forming Shallow Trench Isolation (STI) regions extending from a top surface of a semiconductor substrate into the semiconductor substrate, with a portion of the semiconductor substrate between two neighboring ones of the STI regions forming a semiconductor strip;
   after the forming the STI regions, thinning an upper portion of the semiconductor strip, wherein a lower portion of the semiconductor strip is not thinned; and
   after the thinning the upper portion of the semiconductor strip, recessing the STI regions, until a portion of the upper portion of the semiconductor strip is higher than top surfaces of remaining portions of the STI regions to form a semiconductor fin, wherein the top surfaces of the remaining portions of the STI regions are level with or higher than a bottom of the upper portion of the semiconductor strip.

15. The method of claim 14, wherein at a time the thinning the upper portion of the semiconductor strip is performed, a pad oxide layer is located over the semiconductor strip.

16. The method of claim 14, wherein the thinning the upper portion of the semiconductor strip comprises an oxidation of the upper portion of the semiconductor strip.

17. The method of claim 14, wherein the thinning the upper portion of the semiconductor strip is performed using In-Situ Steam Generation (ISSG).

18. The method of claim 14, wherein at a time the thinning the upper portion of the semiconductor strip is performed, top surfaces of the STI regions are higher than a top surface of the semiconductor strip.

19. The method of claim 14 further comprising:
   before the forming the STI regions, forming a hard mask layer over the semiconductor strip; and
   after the forming the STI regions and before the thinning the upper portion of the semiconductor strip, removing the hard mask layer.

20. The method of claim 14, wherein the upper portion of the semiconductor strip has a height between about 2 percent and about 40 percent of a total height of the semiconductor strip.

* * * * *